United States Patent
Feigl et al.

(10) Patent No.: US 9,728,918 B2
(45) Date of Patent: Aug. 8, 2017

(54) DISTRIBUTION STRIP

(71) Applicant: Knuerr GmbH, Arnstorf (DE)

(72) Inventors: Josef Feigl, Arnstorf (DE); Christian Stepputat, Passau (DE)

(73) Assignee: Knuerr GmbH, Arnstorf (DE)

( * ) Notice: Subject to any disclaimer, the term of this patent is extended or adjusted under 35 U.S.C. 154(b) by 366 days.

(21) Appl. No.: 14/251,073

(22) Filed: Apr. 11, 2014

(65) Prior Publication Data

US 2014/0346866 A1  Nov. 27, 2014

(30) Foreign Application Priority Data

May 22, 2013 (EP) ..................... 13168708

(51) Int. Cl.
*H01R 25/00* (2006.01)
*H05K 7/14* (2006.01)
*H01R 13/58* (2006.01)

(52) U.S. Cl.
CPC ......... *H01R 25/003* (2013.01); *H05K 7/1492* (2013.01); *H01R 13/5841* (2013.01); *Y10T 307/25* (2015.04)

(58) Field of Classification Search
None
See application file for complete search history.

(56) References Cited

U.S. PATENT DOCUMENTS

| | | | |
|---|---|---|---|
| 6,229,691 B1 * | 5/2001 | Tanzer | H01R 25/006 361/610 |
| 7,507,097 B2 | 3/2009 | Stockel | |
| 7,522,036 B1 | 4/2009 | Preuss et al. | |
| 8,187,028 B2 | 5/2012 | Feigl | |
| 8,416,565 B1 | 4/2013 | Ross | |
| 2005/0000786 A1 * | 1/2005 | Huang | H01R 13/465 200/310 |
| 2005/0259383 A1 | 11/2005 | Ewing et al. | |
| 2007/0072487 A1 | 3/2007 | Gorman | |

FOREIGN PATENT DOCUMENTS

| | | |
|---|---|---|
| CN | 101053128 A | 10/2007 |
| CN | 201590605 U | 9/2010 |
| EP | 0938175 A1 | 8/1999 |
| EP | 2321882 A1 | 5/2011 |
| JP | S49-52096 | 5/1974 |
| JP | S51-21892 | 2/1976 |
| JP | S52-72092 | 5/1977 |

(Continued)

OTHER PUBLICATIONS

European Search Report for corresponding European application No. EP 13174491, dated May 9, 2014, 2 pages.

(Continued)

*Primary Examiner* — Rexford Barnie
*Assistant Examiner* — Swarna N Chowdhuri
(74) *Attorney, Agent, or Firm* — Harness, Dickey & Pierce, P.L.C.

(57) ABSTRACT

The invention relates to a distribution strip for distributing electrical energy for equipment, device and/or server cabinets. The distribution strip has an inner chamber which is defined by an upper, lower, two lateral side faces and two end faces. A feed cable is provided on one of the end faces. An end face forms, with a side face, an inner angle of greater than 105°.

11 Claims, 6 Drawing Sheets

(56) References Cited

FOREIGN PATENT DOCUMENTS

| JP | S58-15813 A | 1/1983 |
|----|-------------|--------|
| JP | H59-21517 | 2/1984 |
| JP | S63-70658 | 5/1988 |
| JP | H3-56183 | 5/1991 |
| JP | H4-76282 | 7/1992 |
| JP | 2000340967 A | 12/2000 |
| JP | 201097875 | 4/2010 |

OTHER PUBLICATIONS

Chinese search report for corresponding Chinese application No. 2014102150164, dated Dec. 4, 2015, 2 pages.

\* cited by examiner

DISTRIBUTION STRIP

FIELD

The invention relates to a distribution strip for distributing electrical energy for equipment, devices and/or server cabinets and to a device cabinet having a distribution strip according to the invention.

BACKGROUND

Distribution strips serve for the distribution of electrical energy to electrical and/or electronic devices or structural units which are arranged in a device or a server cabinet. Expressed in general terms, a distribution strip supplies electrical consumers with energy. Devices or structural units supplied in this way are for example servers such as blade servers, telecommunications devices, climate control devices or switches. A distribution strip can also be described as a power strip or power distribution unit (PDU).

Generic distribution strips comprise an upper, a lower and two lateral elongated side faces as well as a first and a second end face, which together define an inner chamber. In most cases a feed cable is provided on the first end face for supplying electrical energy. This feed cable serves to connect the distribution strip to an external energy source, for example a power network. Furthermore, such distribution strips comprise connecting means provided on the upper side face, to which connecting means the electrical consumers to be supplied can be connected for power supply.

Such distribution strips are often arranged vertically in a device or server cabinet. The feed cable must hereby be laid through the device cabinet and led out of said cabinet for connection to a power connection, such as a socket. In the same way the feed cable can be connected to the building or computer centre power supply.

Where the feed cable leaves the distribution strip on an end face thereof, however, problems can arise with the guiding of the feed cable in the device or server cabinet. Exit on the end face requires either a higher structural height of the server cabinet or a very high or distinct flexibility of the cable in order to be able to lay the cable with sufficient degrees of freedom.

A high flexibility of the feed cable is not always present, however, as relatively thick and thus rigid cables must often be used in order to adequately feed energy into the distribution strip. Different configurations of such distribution strips are thus known, in which for example the direction of exit of the feed cable is not formed along the first end face, but instead on a side face, for example the upper side face. Such constructions do indeed facilitate a low structural height of the server or device cabinet, but also offer low flexibility when using the distribution strip. This means for example that a respective individual distribution strip must be available for incorporation to the left or to the right in the cabinet.

Other constructions are also known, in which a plurality of feed cables are guided out of the distribution strip centrally on a side face. Such a construction is described for example in EP 2321882 B1.

Furthermore distribution strips are known which have a complex rotation mechanism for the feed cable on an end face. The rotation mechanism requires, however, relatively great resources and is often prone to error.

SUMMARY

In one aspect the present disclosure relates to a distribution strip for distributing electrical energy for device and/or server cabinets. The distribution strip may have an upper face, a lower face, two lateral elongated side faces, a first end face and a second end face, which cooperatively define an inner chamber. A feed cable may be provided on the first end face for supplying electrical energy to the distribution strip. A plurality of connecting means may be provided on the upper side face to which electrical Consumers can be connected to receive the energy supplied from the distribution strip. The first end face forms, with the upper side face, an inner angle of greater than 105°.

DRAWINGS

The drawings described herein are for illustrative purposes only of selected embodiments and not all possible implementations, and are not intended to limit the scope of the present disclosure.

DETAILED DESCRIPTION

It is an object of the invention to create a distribution strip which offers a relatively great degree of freedom in the laying of the feed cable.

The object is achieved according to the invention through a distribution strip having the features of claim 1 and a device and/or server cabinet having the features of claim 15.

Preferred embodiments of the invention are reproduced in the dependent claims and in the description of the figures.

A generic distribution strip is developed according to the invention in that the first end face forms, together with a side face, an inner angle of ≥105°, preferably 110° to 120°.

A core idea of the invention can be seen in that, deviating from the rigid form of a distribution strip similar to an elongated cuboid, the first end face, from which the feed cable exits, is formed obliquely relative to at least one end face. This has the advantage that the feed cable already exits the distribution strip at a defined angle. Depending upon the exact angle of the first end face to the side face, with the distribution strip it is thereby possible, even with low flexibility of the feed cable, to facilitate a simpler guiding of the feed cable in or out at a desired angle. For example the guiding of the feed cable at an angle of 90° relative to the upper side face or parallel to the upper side face is possible through the inventive construction, even with relatively rigid cables. Conventionally, two different distribution strips would have had to be provided for this.

According to a preferred embodiment of the distribution strip according to the invention the inner chamber of the distribution strip and/or the distribution strip itself has essentially the basic form of an elongated cuboid with a wedge element positioned or set on the end face. Through this configuration there is a deviation from the conventional cuboid-like form. The positioned wedge element can be formed through the first end face and the corresponding side faces. The upper side face can hereby be formed to be shorter than the lower side face lying opposite it. In this case an inner angle, which is greater than 105°, is formed between the first end face and the upper side face. This angle is preferably between 110° and 120°.

With such a construction the feed cable can exit at an angle which is between 90° relative to the upper side face and parallel to the upper side face. Even with a limited flexibility of the feed cable, cable guiding can thus be selected with a relatively high degree of freedom. The desired direction of exit or entry of the feed cable can be achieved over a shorter distance. If for example the feed cable is to be guided at an angle of 90° relative to the upper side face, it is necessary—according to the exact inclination of the first end face—to only achieve an angle of e.g. 60° by means of the cable. In contrast with this, with a conventional construction with exit on the end face, which extends substantially parallel to the side faces, an angle of 90° must be overcome.

A depression is advantageously formed in the first end face, whereby a feed-through into the inner chamber for the feed cable is formed in the bottom region of the depression. By providing the feed-through for the feed cable in a depression, the degree of freedom and the possible bending angle of the feed cable can be formed even more flexibly. The flexibility for the possible laying within a server cabinet is also hereby increased.

It is hereby preferable if the depression is formed so that it tapers. Such a formation facilitates a greater scope for the cable as it exits the distribution strip, whereby the necessary bending angle can be reduced and thus the degree of freedom achieved with the bending angle can be further enlarged.

According to an advantageous embodiment the depression is formed to extend as far as the upper side face. Through this construction, in particular, a bending of the feed cable in the direction of the upper side face is simplified. This facilitates a substantially better and simpler guiding of the cable at an angle of 90° perpendicularly away from the side face. It is also possible to guide the feed cable even further in the direction of the upper side face so that angles of less than 90° can be achieved between the cable and the upper side face.

The depression can advantageously have a rounded convex form. It can hereby be formed similarly to a half sphere. It has been shown that through such a construction the possible bending angles can be further reduced, as already at the exit of the feed cable in the depression a relatively large variation of the exit angle or the possibility of a change of direction directly after exit can be achieved.

It is preferable if the feed cable extends substantially perpendicularly through the first end face. This relates in particular to the break-through or passage through the first end face. With such a construction, in turn, a degree of freedom which is as great as possible is facilitated for bending and guiding the feed cable, both in a plane parallel to the upper side face and also in a plane perpendicular to the upper side face.

It is further preferable if a flexible sealing sleeve is provided in the region of the passage opening. This sealing sleeve serves on the one hand to close the passage opening with the feed cable so that it is as dustproof as possible. On the other hand it also offers the possibility of forming the passage opening to be larger than the feed cable and thus allowing the feed cable to move within the passage opening. The exact exit angle or entry angle of the feed cable from or into the distribution strip can hereby already be smaller than 90° relative to the first end face.

According to the meaning of the invention the bending angle can be understood to be the angle with which the feed cable must be bent in order to pass from the exit opening out of the first end face in the direction, in which the feed cable is to be further guided. For example, in case of a conventional distribution strip, if the feed cable is to be guided at an angle of 90° away from the upper side face, a bending angle of 90° is necessary.

It is preferable if a slot-like clamping means is respectively formed in the contact region between the lower side face and the first and the second end face. A first and a second fixing means can be provided for example in this clamping means to fix the distribution strip in a device and/or server cabinet. By means of the fixing means it is easily possible to incorporate the distribution strip on existing counterpart elements within the device cabinet.

It is advantageous if the first fixing means can be inserted into a groove of the device and/or server cabinet, and/or the second fixing means is formed so that in can engage by means of spring force in a second groove of the device and/or server cabinet lying opposite the first groove. The grooves can hereby be formed by the profiles, provided as standard, of the device and/or server cabinet. By means of the construction of the first and second fixing means according to the invention, therefore, a tool-free assembly possibility is indicated for a distribution strip.

In this connection the distribution strip can be inserted into the first groove of the device and server cabinet by means of the first fixing means. Subsequently, by overcoming a spring force, the second fixing means is engaged in a second groove lying opposite the first groove.

For example the second fixing means can be formed to project away from the distribution strip and be designed in such a way that it is compressible against a spring force in the direction of the distribution strip. By means of the spring force required to compress the second fixing means, in the operational state, the distribution strip is held securely in the device and/or server cabinet. In other words, when using or engaging the second fixing means, firstly the spring force must be overcome.

According to a preferred embodiment the distribution strip has essentially a length for vertical fixing in a device and/or server cabinet with 42 height units (HEs). In particular it is important with such a formation to facilitate a high flexibility when laying the feed cable in the device and/or server cabinet in order that, irrespectively of the exact space available in the device and/or server cabinet, the same distribution strip can be used in each case. The space available in the device and/or server cabinet is measured at least in part according to the incorporated components, but also according to the construction of the cabinet itself.

The distribution strip according to the invention can be used in a device and/or server cabinet. Besides the simplification in keeping the supply of such distribution strips, there is the additional advantage that in the case of a change or refitting or supplementing of the device and/or server cabinet, as a result of the high flexibility of the distribution strip or the laying of the feed cable thereof, no further new distribution strip needs to be incorporated if the space conditions for guiding the feed cable change.

Figure 1:
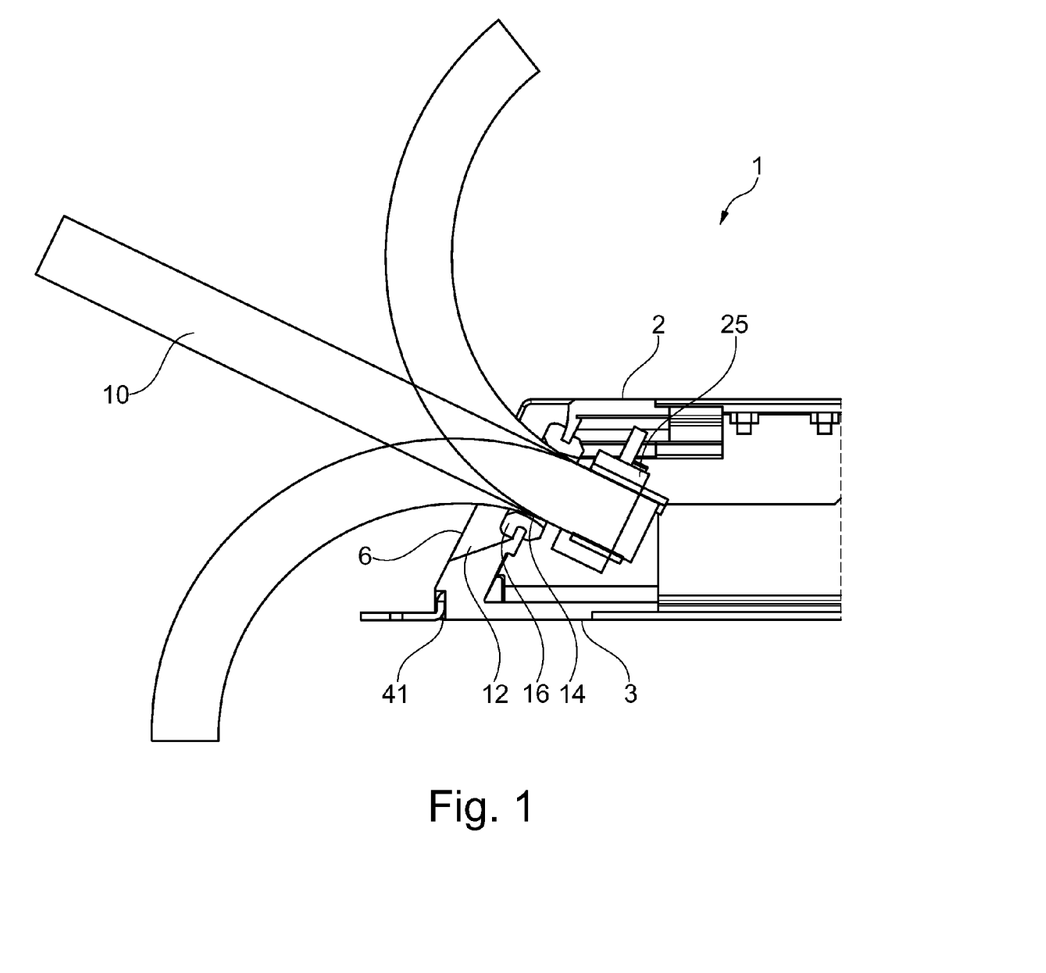
FIG. 1 shows a sectional side view of a front part of a distribution strip according to the invention.

FIG. 1 shows a sectional side view of a front part of a distribution strip 1 according to the invention. An upper side face 2, a lower side face 3, the first end face 6 hereby define—together with the left and right lateral elongated side faces S1 and S2 (not shown in FIG. 1 but shown in FIG. 2) and a rear side face 71 (not shown in FIG. 1 but shown in FIG. 8)—an inner chamber. The first end face 6 is at an angle of approximately 115° relative to the upper side face 2. Accordingly the angle between the first end face 6 and the lower side face 3 is around 65°.

This figure shows a feed cable 10 projecting out of the distribution strip 1 in three possible positions.

A depression 12 is formed on the first end face 6, said depression 12 extending as far as the upper side face 2. At the end of the depression 12, a passage opening 14 for the feed cable 10 is provided. Through this passage opening 14, the feed cable 10 enters into the inner space of the distribution strip 1. In the region of the passage opening 14 a flexible sealing sleeve 16 is arranged. This serves on the one hand to prevent or limit the entry of dust inside the distribution strip 1 and on the other hand it facilitates, through a flexible formation, an improved bending possibility of the feed cable 10.

Inside the distribution strip 1 there is a strain relief means 25 which is formed substantially parallel to the first end face 6. Following the strain relief means which engages on the outer jacket of the feed cable, the individual conductors (not shown) are connected to the electronic unit for forwarding the electrical energy. The strain relief means 25 is fixedly arranged in the inner chamber of the distribution strip 1. The construction according to the invention does not therefore require any movable elements in order to achieve the higher degrees of freedom in laying the feed cable 10.

A clamping means 41, in which a means for screwing or fixing the distribution strip 1 in a device and/or server cabinet is provided, is arranged in the contact region between the lower side face 3 and the first end face 1.

FIGS. 2 to 6 show a front part of the distribution strip 1 of FIG. 1 according to the invention, wherein the feed cable 10 is respectively differently orientated.

Figure 2:
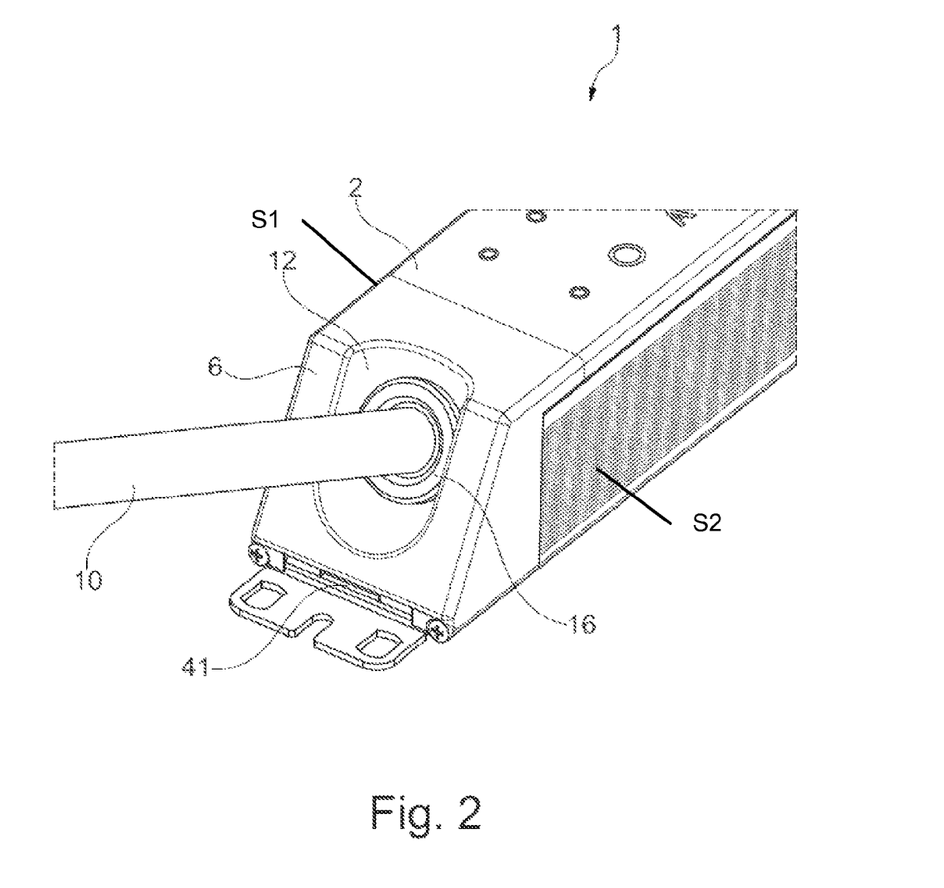
FIG. 2 shows a perspective view of a front part of the inventive distribution strip of FIG. 1 with a straightly guided feed cable.
Figure 3:
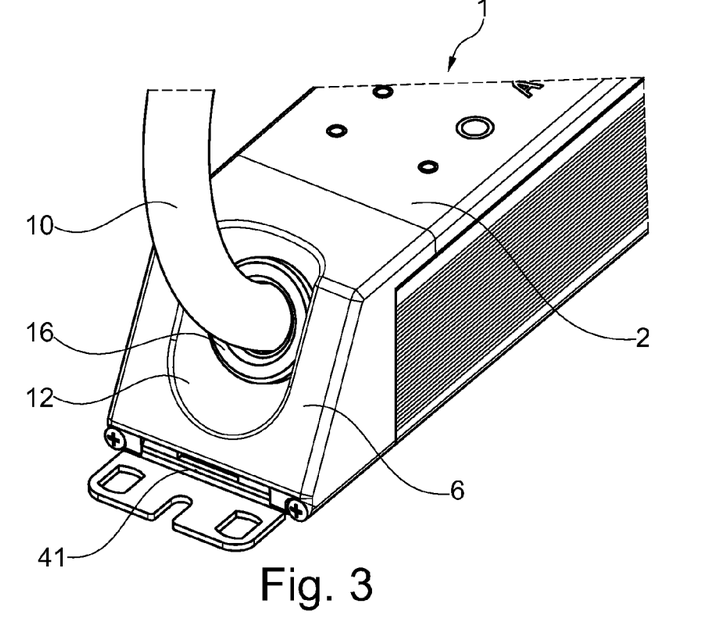
FIG. 3 shows a perspective view of a front part of the inventive distribution strip of FIG. 1 with upwardly guided feed cable.
Figure 4:
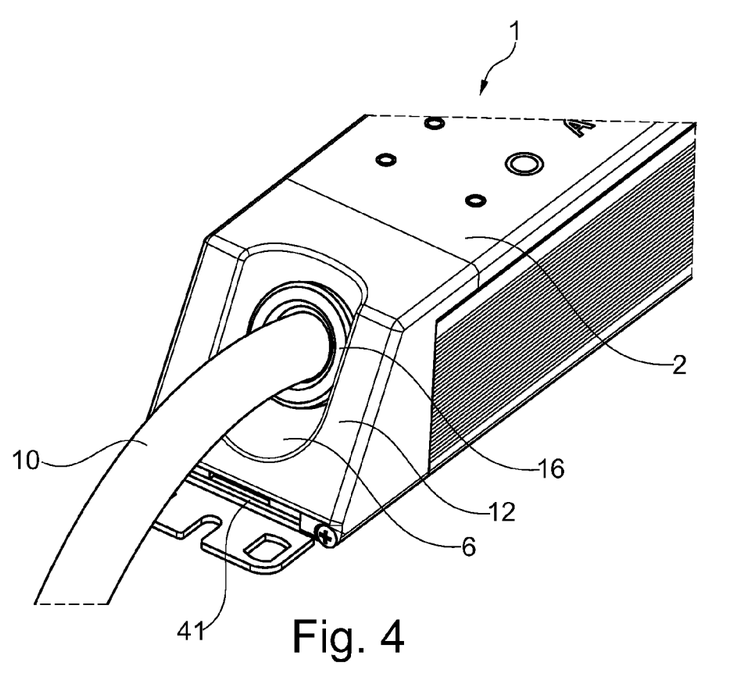
FIG. 4 shows a perspective view of a front part of the inventive distribution strip of FIG. 1 with downwardly guided feed cable.
Figure 5:
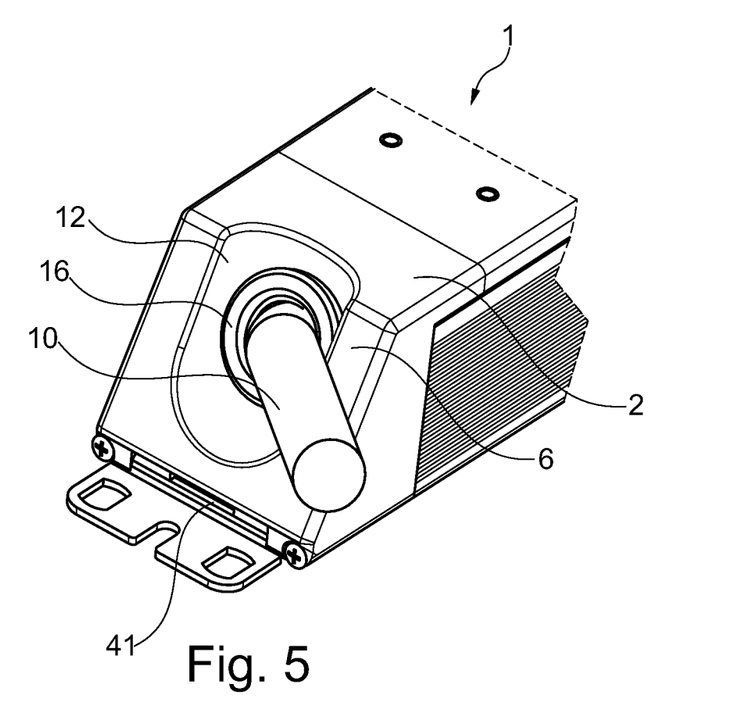
FIG. 5 shows a perspective view of a front part of the inventive distribution strip of FIG. 1 with feed cable guided to the right.
Figure 6:
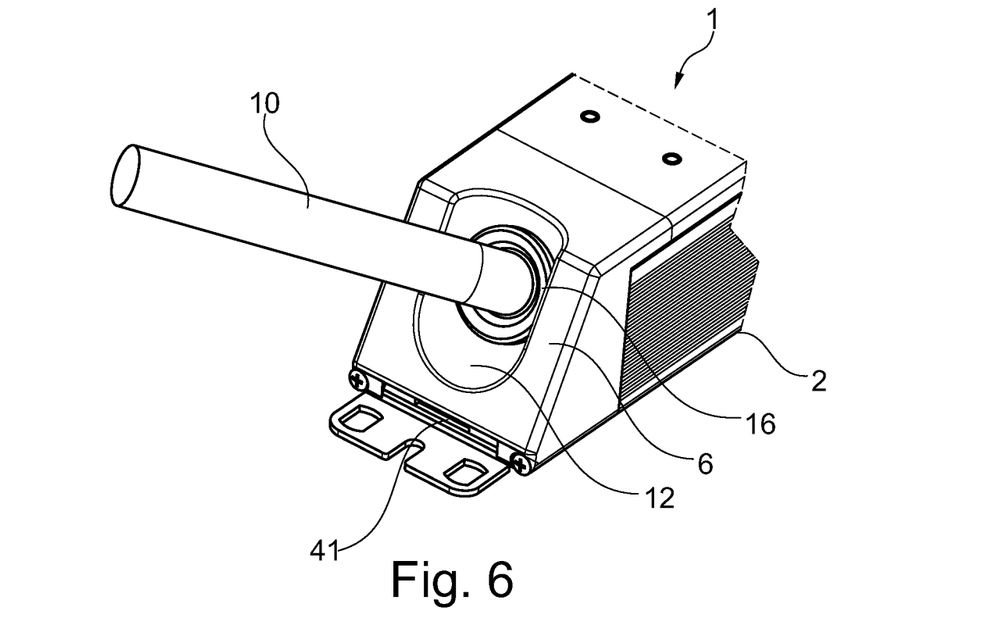
FIG. 6 shows a perspective view of a front part of the inventive distribution strip of FIG. 1 with feed cable guided to the left.

In FIG. 2 the feed cable 10 is led in a basically straight manner out of the distribution strip 1, that is to say perpendicular to the first end face 6. In FIG. 3 it is guided out being bent upwards, in FIG. 4 it is guided out being bent downwards. In FIG. 5 the feed cable 10 is guided out being bent to the right and in FIG. 6 it is guided out being bent to the left.

As can be seen from FIGS. 3 to 6, through the inventive construction of an inclined end face 6 and a depression 12 in the end face 6, it is possible to guide the feed cable 10 outwards or onwards in different directions. In other words, the feed cable 10 can be guided out of the distribution strip 1 both in a plane parallel to the upper side face 2 and also perpendicular thereto. As the guiding outwards into these two planes is not mutually excluded or exclusive here, the angle thereby defined can be combined so that a very high degree of freedom can be achieved when guiding out the feed cable 10. In addition, in dependence upon the desired direction of the feed cable 10, only smaller bending angles need to be achieved with the cable itself in comparison with distribution strips of the prior art.

In addition to the more flexible exit from the distribution strip 1 according to the invention, the flexibility of the feed cable 10, available in principle, is also hereby used.

In principle an embodiment without a depression 12 is also conceivable. An advantage of the depression 12 in contrast with an embodiment without a depression, however, is that a bending of the feed cable 10 can be started earlier, commencing at the inner chamber of the distribution strip 1, and the feed cable 10 can thus be guided more quickly in the desired direction. "More quickly" is to be understood here in the sense of a smaller bending angle or being achieved earlier.

A further advantage of the invention is the use of the sealing sleeve 16. Through the flexible design of this sealing sleeve 16, it is possible for the feed cable 10 to move easily within the passage opening 14. The flexibility of the feed cable 10 can hereby be further increased and the exit direction thereof further varied.

Having regard to FIGS. 7 to 10, a possible embodiment of the end-face fixing means for the distribution strip 1 according to the invention will now be further examined.

Figure 7:
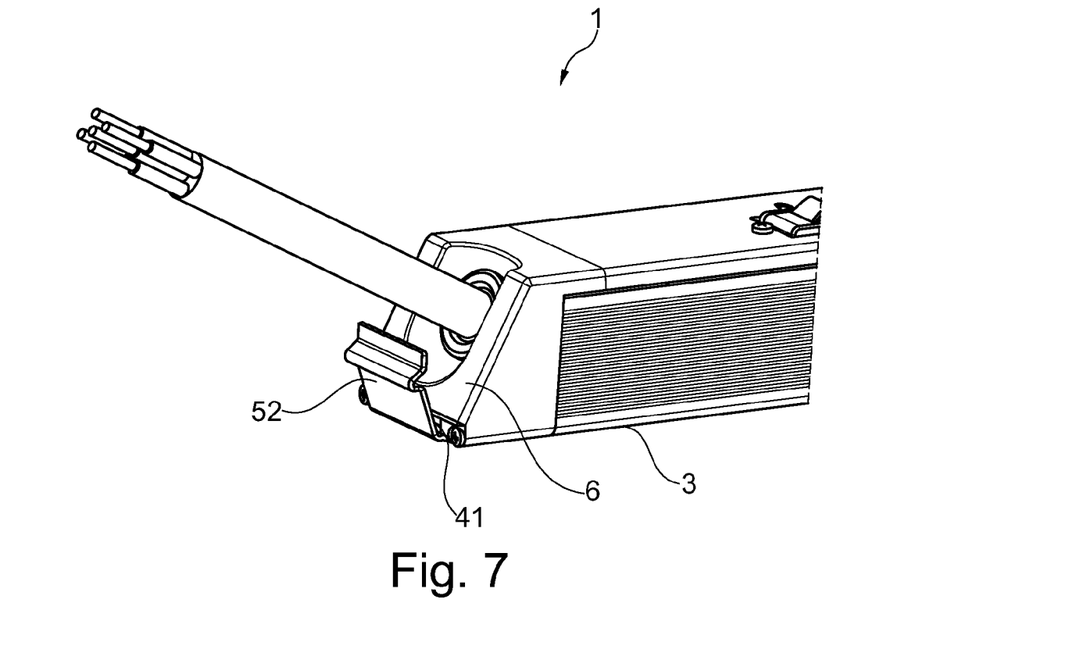
FIG. 7 shows a perspective view of a front part of an inventive distribution strip with fixing means.
Figure 8:
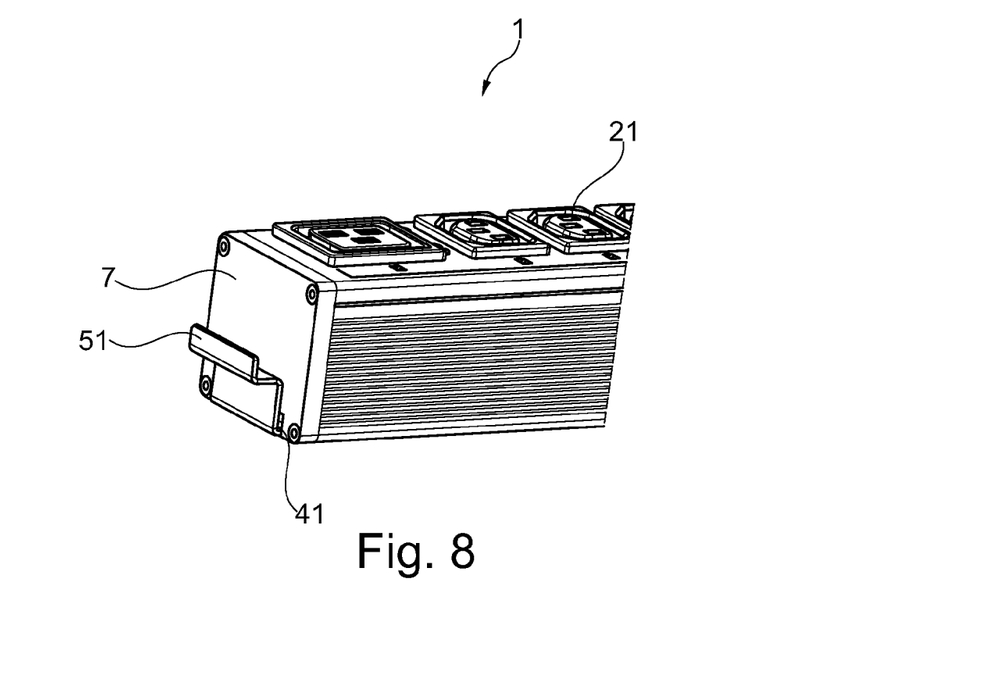
FIG. 8 shows a perspective view of a rear part of an inventive distribution strip with fixing means.

FIG. 7 hereby shows a perspective view of a front part of a distribution strip 1 according to the invention and FIG. 8 shows a perspective view of a rear part of a distribution strip 1 according to the invention. A second fixing means 52 is provided in a clamping means 41 which is formed in the contact region between the lower side face 3 and the first end face 6.

A first fixing means 51 formed complementarily to the second fixing means 52 is shown in FIG. 8. In addition, in the rear region of the distribution strip 1 in FIG. 8, in an exemplary manner connecting means 21 are provided, here as IEC power connectors (IEC 60320) or inlet connectors for non-heating apparatus. In principle these can also be formed as desired according to appropriate standards.

The second fixing means 52 and also the first fixing means 51 can also be provided without a clamping means 41 on the distribution strip. The formation with a clamping means 41 offers the advantage that different fixing means can be used. For example a different embodiment of a fixing means is used and shown in FIGS. 3 to 6.

In the rear part of the distribution strip 1, a clamping means 41 is also provided in the contact region of the lower side face 3 with the second end face 7. The first fixing means 51 is inserted herein.

Figure 9:
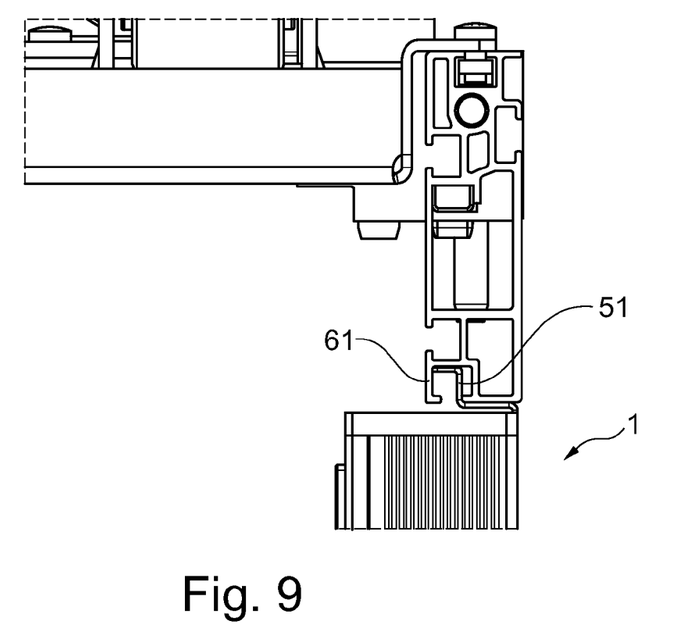
FIG. 9 shows a side view of a rear part of an incorporated inventive distribution strip.
Figure 10:
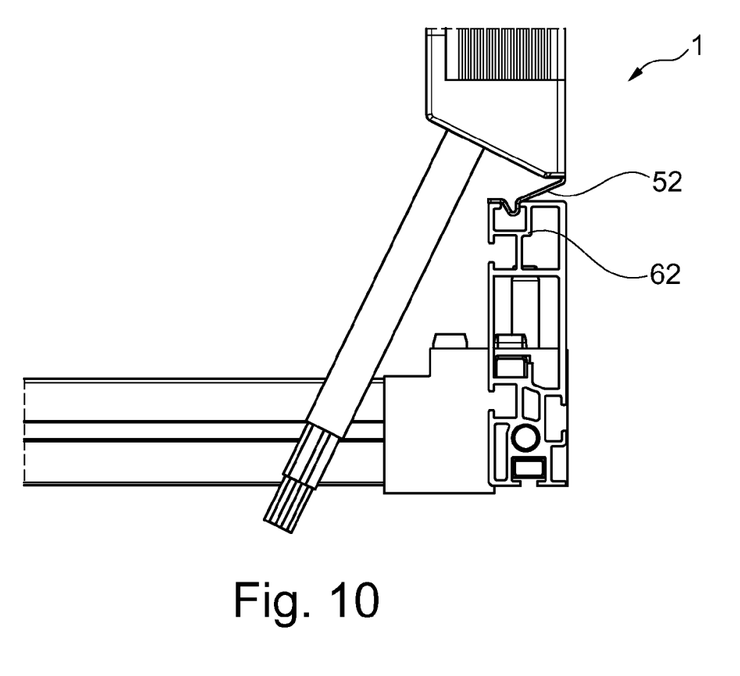
FIG. 10 shows a side view of a front part of an incorporated inventive distribution strip.

By reference to FIGS. 9 and 10, the embodiment of the first and second fixing means 51 and 52 is explained in greater detail.

FIG. 9 shows a rear cut-out of a distribution strip 1 in the incorporated state. FIG. 10 shows a front cut-out of a distribution strip 1 also in the incorporated state.

In other words, FIGS. 9 and 10 could also be regarded as the upper region and lower region of a device and/or server cabinet, in which the distribution strip 1 according to the invention is vertically incorporated. The first fixing means 51 has a step-form cross-section, with which step-form it can be inserted into a groove 61 formed in the profiles of a device and/or server cabinet. It is hereby preferable for the fixing means 51 to be formed complementarily to the corresponding groove 61.

The second fixing means 52 is also inserted in FIG. 10 into a groove 62 formed in the frame profile of the server cabinet. The second fixing means 52 hereby has a form extending in an inclined manner away from the distribution strip 1. It has a projecting part which can engage in the groove 62. The construction on the second fixing means 52 is such that it can be pressed back by force in the direction of the distribution strip 1.

This is used to insert the distribution strip 1 into a server and/or device cabinet. In this connection, firstly the first fixing means 51 is inserted into the groove 61. Subsequently the distribution strip 1 is engaged in the second groove 62 by overcoming a spring force of the second fixing means 52. The second fixing means 52 is thereby pressed during the insertion process in the direction of the distribution strip 1. As soon as a projection of the second fixing means 52 comes to lie in the region of the groove 62, the spring force causes the projection to spring into the groove 62 and to easily clamp with it. The distribution strip 1 is thus fixed in the server cabinet.

High degrees of freedom can thus be achieved with the distribution strip according to the invention in the laying of a feed cable without using different distribution strips.

The invention claimed is:

1. A distribution strip for distributing electrical energy for device and/or server cabinets, comprising:
    an upper, a lower and two lateral elongated side faces and a first and a second end face, which define an inner chamber;
    a feed cable provided on the first end face for supplying electrical energy and a plurality of connecting means provided on the upper side face, to which electrical consumers can be connected for the energy supply; and
    wherein the first end face forms, with a side face, an inner angle of greater than 105°;
    wherein a depression is formed in the first end face, and a passage opening into the inner chamber is formed for the feed cable in a bottom region of the depression; and
    wherein the depression is tapered;
    wherein the passage opening is larger than the feed cable; and
    wherein a flexible sealing sleeve that surrounds the feed cable is provided in a region of the passage opening for providing movability of the feed cable inside the passage opening.

2. The distribution strip according to claim 1, wherein:
    a form of the inner chamber corresponds substantially to that of an elongated cuboid with a wedge element positioned on an end face.

3. The distribution strip according to claim 1, wherein:
    the upper side face is formed to be shorter than the lower side face lying opposite thereto.

4. The distribution strip according to claim 1, wherein:
    the depression extends as far as the side face.

5. The distribution strip according to claim 1, wherein:
    the depression has a rounded convex form.

6. The distribution strip according to claim 1, wherein:
    the feed cable extends perpendicularly through the first end face.

7. The distribution strip according to claim 1, wherein:
    a slot-form clamping means is respectively formed in a contact region between the lower side face and the first and the second end faces.

8. The distribution strip according to claim 7, wherein:
    a first and a second fixing means are provided in the clamping means for fixing the distribution strip in a device and/or server cabinet.

9. A distribution strip according to claim 8 wherein:
    the first fixing means can be inserted into a first groove of the device and/or server cabinet; and
    the second fixing means is formed so that it can engage by means of spring force in a second groove, lying opposite the first groove, of the device and/or server cabinet.

10. The distribution strip according to claim 9, wherein:
    the second fixing means is formed projecting away from the distribution strip; and
    the second fixing means is formed so that it can be compressed against a spring force in the direction of the distribution strip.

11. The distribution strip according to claim 1, wherein:
    the distribution strip has essentially a length for vertical fixing in a device and/or server cabinet.

* * * * *